United States Patent [19]
Sugou

[11] Patent Number: 4,791,647
[45] Date of Patent: Dec. 13, 1988

[54] SEMICONDUCTOR LASER

[75] Inventor: Shigeo Sugou, Tokyo, Japan

[73] Assignee: NEC Corporation, Tokyo, Japan

[21] Appl. No.: 63,056

[22] Filed: Jun. 17, 1987

[30] Foreign Application Priority Data

Jun. 17, 1986 [JP] Japan .................................. 61-141723
Feb. 17, 1987 [JP] Japan .................................. 62-32410

[51] Int. Cl.⁴ .............................................. H01S 3/19
[52] U.S. Cl. .............................................. 372/45; 372/46
[58] Field of Search .................................... 372/43–48

[56] References Cited

U.S. PATENT DOCUMENTS 4,166,278 8/1979 Susaki et al. ........................... 372/47

OTHER PUBLICATIONS

Lee et al, "GaAs–GaAlAs Injection Lasers on Semi-Insulating Substrates Using Laterally Diffused Junctions", Appl. Phys. Lett. 32(7), 1 Apr. 1978, pp. 410–412.

Primary Examiner—William L. Sikes
Assistant Examiner—Georgia Y. Epps
Attorney, Agent, or Firm—Sughrue, Mion, Zinn, Macpeak, and Seas

[57] ABSTRACT

An improved semiconductor laser comprises the first and second cladding portions respectively formed on a semi-insulating substrate, an active region sandwiched between the first and second cladding portions, and the first and second electrodes respectively provided on the first and second cladding portions. The first cladding portion includes a semiconductor layer and semi-insulating semiconductor layers provided on the top and back sides of the semiconductor layer so that carries are injected into an active region which is in contact with the side wall of the semiconductor layer, while current leakage is prevented from being produced because the carrier are not injected into other portion than the active region. An improved process of the fabrication of a semiconductor laser comprises forming the first cladding portion to have a vertical side wall from which a side wall of a semiconductor layer is exposed so that an active region is easily formed to be in contact with the side wall of the semiconductor layer.

3 Claims, 3 Drawing Sheets

SEMICONDUCTOR LASER

FIELD OF THE INVENTION

The invention relates to a semiconductor laser and process of the fabrication of the same, and more particularly to a semiconducter laser which is utilized for an optical communication system, printing apparatus, copying machine etc. and process of the fabrication of such a semiconductor laser.

BACKGROUND OF THE INVENTION

A semiconductor laser to be fabricated on a semi-insulating substrate is expected to result in advantageous high frequency characteristics because parastici capacitance produced by its electrodes is extremely small. Such a type of a conventional semiconductor laser is described on pages 410 to 412 of "Applied Physics Letters, 32(7)" published on Apr. 1, 1978. The semiconductor laser comprises a lower n-cladding layer formed on a semi-insulating substrate, an active layer formed on the lower n-cladding layer, an upper n-cladding layer formed on the active layer, a Zn-diffused p+ region formed across the upper and lower n-cladding layers and active layer, n and p-electrodes respectively positioned on the upper n-cladding layer and Zn-diffused p+region, and an insulating layer formed between the n and p-electrodes. The active layer includes an active region in which electrons and holes are recombined and which is limited transversely to be narrowly striped.

In operation, the current confining is effected in accordance with the difference of built-in potentials between pn-junctions at the n-cladding layer and active layer so that electrons are injected to the active region through the n-cladding layers and active layer from the n-electrode, while holes are injected thereto through the Zn-cladding region from the p-electrode. As a result, the semiconductor laser oscillates in the active region in a transverse mode dependent upon the difference of refractive indexes at pn-junctions. The parasitic capacitance thereof is produced in accordance with pn-junctions at the n-cladding layers, while a resonator is structured therein between cleaved facets thereof.

In the semiconductor laser, however, there is a disadvantage that current leakage is large in a case where a high power is output therefrom for the reason why the current confining is effected in accordance with the difference of built-in potentials between pn-junctions at the n-cladding layers and active layer as mentioned before. Further, there is another disadvantage that a high frequency characteristic is lowered due to the parasitic capacitance produced by pn-junctions at the n-cladding layers. Still further, manufacturing yield is not so high as expected in fabricating semiconductor lasers for the reason why it is very difficult to diffuse Zn to a predetermined extent.

The U.S. Pat. No. 4,636,821 also discloses such a type of another conventional semiconductor laser which comprises n and p-conductive layers formed to have a predetermined width of a groove therebetween on a semi-insulating substrate, an active region formed in the groove, a semi-insulating cap layer formed on the active region in the groove, n and p-electrodes provided respectively on the n and p-conductive layers, and an insulating layer positioned between the n and p-electrodes.

In operation, electrons are injected to the active region through the n-conductive layer from the n-electrode, while holes are injected thereto through the p-conductive layer from the p-electrode. As a result, the semiconductor laser oscillates in the active region in a transverse mode dependent upon the difference of refractive indexes between the active region, and the n and p-conductive layers, semi-insulating cap layer and semi-insulating substrate.

In the latter semiconductor laser, however, there is a disadvantage that the electric resistance thereof is as large as several 10$\Omega$ for the reason why the active region is actually 0.1 $\mu$m in accordance with the requirement of a single transverse mode so that a considerable amount of heat is generated in 0.1 $\mu$m slit-shaped semiconductor layer.

SUMMARY OF THE INVENTION

Accordingly, it is an object of the invention to provide a semiconductor laser in which current leakage is decreased down to a desired level, while electric resistance does not become large.

It is a further object of the invention to provide a semiconductor laser in which a high speed modulation can be performed by decreasing parasitic capacitance thereof.

It is a still further object of the invention to provide a process of the fabrication of a semiconductor laser wherein parameters for fabricating a semiconductor laser are easily controlled so that a high manfacturing yield is resulted.

According to a feature of the invention, a semiconductor laser comprises, a semi-insulating substrate, first and second cladding portions forming on said semi-insulating substrate, an active region formed between said first and second cladding portions, and first and second electrodes respectively provided on said first and second cladding portions, wherein said active region has a predetermined value of band gap, said first cladding portion includes a semiconductor layer having a larger value of band gap than said predetermined value and a pair of semi-insulating semiconductor layers respectively formed on the top and back surfaces of said semiconductor layer and having larger values of band gaps larger than said larger value, and said second cladding portion is of a reverse conductive type to that of said semiconductor layer and has a larger value of band gap than said predetermined value.

According to another feature of the invention, a process of the fabrication of a semiconductor laser comprises, forming a semi-insulating semiconductor layer, semiconductor layer and semi-insulating semiconductor layer in turn on a semi-insulating substrate, said semiconductor layer having a larger value of band gap than a predetermined value, and said semi-insulating semiconductor layers respectively having larger values of band gaps than said larger value, etching said semi-insulating semiconductor layers and semiconductor layer by use of a predetermined pattern of a mask to provide first cladding portion of three layers having a vertical side wall, forming an active layer on said vertical side wall of said first cladding portion, said active layer having said predetermined value of band gap, forming second cladding portion on said active layer which is thereby sandwiched between said first and second cladding portions, said second cladding portion being of a reverse conductive type to that of said semiconductor layer and having a larger value of band gap than said predetermined value, and providing first and second electrodes respectively on said first and second cladding portions.

BRIEF DESCRIPTION OF THE DRAWINGS

The invention will be explained in more detail in accordance with following drawings wherein.

DESCRIPTION OF THE PREFERRED EMBODIMENT

Before describing a semiconductor laser according to the invention, conventional semiconductor lasers briefly described before will be explained in conjunction with FIGS. 1 and 2.

Figure 1:
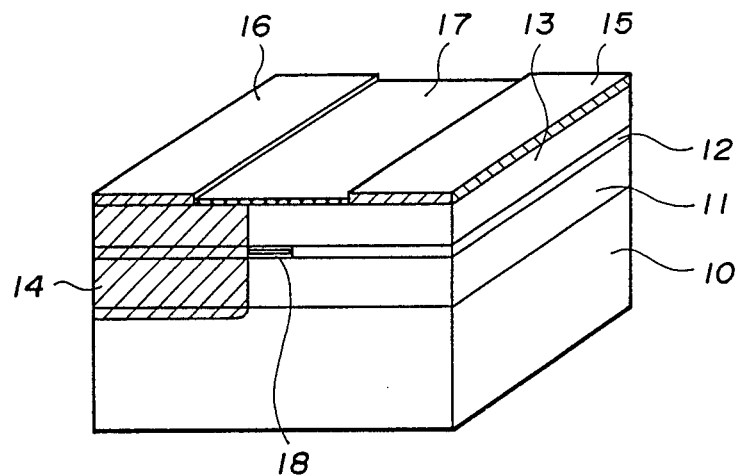
FIG. 1 is an explanatory view illustrating a conventional semiconductor laser.

FIG. 1 shows the former conventional semiconductor laser which comprises a semi-insulating substrate 10 of GaAs, an n-cladding layer 11 of GaAlAs, an active layer 12 of GaAs, an n-cladding layer 13 of GaAlAs, a Zn-diffused p+ region formed across the n-cladding layers 11 and 13 and active layer 12, n and p-electrodes 15 and 16 respectively provided on the n-cladding layer 13 and Zn-diffused p+region 14, and an insulating layer 17 of SiO$_2$ film formed between the n and p-electrodes. The active layer 12 includes an active region 18 in which electrons and holes are recombined and which is limited transversely to be narrowly striped.

Figure 2:
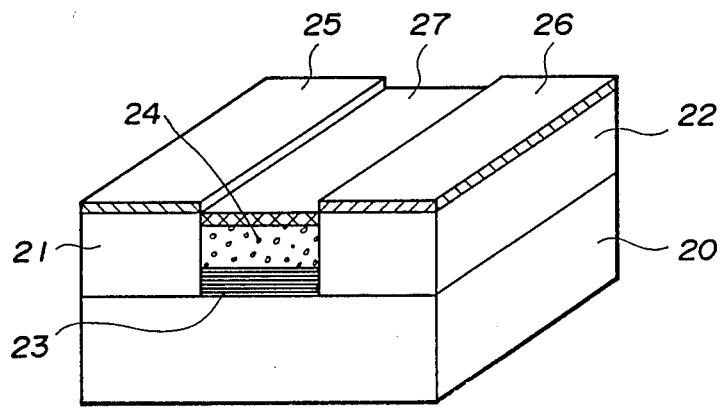
FIG. 2 is an explanatory view illustrating another conventional semiconductor laser.

FIG. 2 shows the latter conventional semiconductor laser which comprises an n-conductive layer 21 provided on a semi-insulating substrate 20, a p-conductive layer 22 provided also on the semi-insulating substrate 20, an active region 23 provided in a groove which is formed between the n and p-conductive layers 21 and 22, a semi-insulating cap layer 24 formed on the active region 23, n and p-electrodes 25 and 26 provided respectively on the n and p-conductive layer 21 and 22, and an insulating layer 27 of SiO$_2$ film formed between the n and p-electrodes 25 and 26.

Opertation of the semiconductor lasers in FIGS. 1 and 2 and disadvantages thereof were described before so that the explanations thereon are omitted here.

Next, preferred embodiments of the invention will be described in detail in conjuntion with FIGS. 3 to 5A and 5B.

Figure 3:
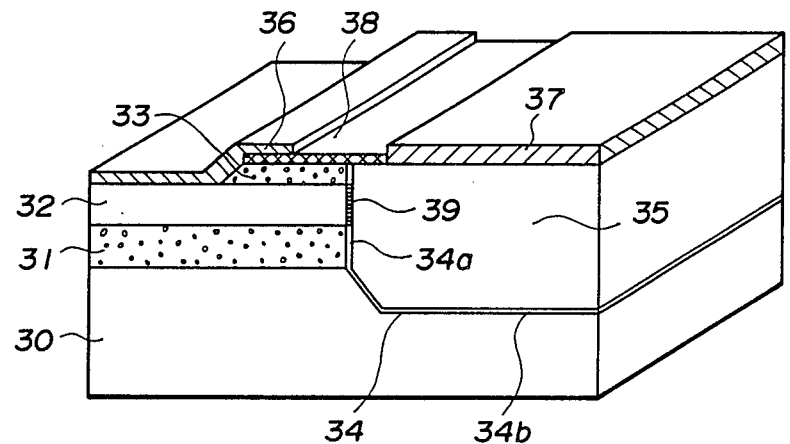
FIG. 3 is an explanatory view illustrating a semiconductor laser in the first embodiment according to the invention.

FIG. 3 shows a semiconductor laser in the first embodiment according to the invention. The semiconductor laser comprises a Fe-doped semi-insulating substrate 30 of InP, a Fe-doped semi-insulating buffer layer 31 of InP having a thickness of 2.5 μm and the band gap of which is 1.35 eV formed on the semi-insulating substrate 30, a S-doped n+- conductive layers 32 of In- GaAsP the density, band gap and thickness of which are $1 \times 10^{18}$cm$^{-3}$, 1.2 eV and 1.5 μm respectively, a Fe-doped semi-insulating cap layer 33 of InP having a thickness of 0.8 μm and the band gap of which is 1.35 eV, an active layer 34 of InGaAsP shaped to have a vertical portion 34a and horizontal portion 34b and the band gap of which is 0.95 eV, a p-conductive layer 35 formed on the vertical and horizontal portions 34a and 34b of the active layer 34, an n-electrode 36 provided on the n+-conductive layer 32, a p-electrode 37 provided on the p-conductive layer 35, and an insulating layer 38 of SiO$_2$ separating the n and p-electrodes 36 and 37 from each other. The active layer 34 includes an active region 39 in the vertical portion 34a along a side wall of the n+-conductive layer 32.

In the semiconductor laser described above, the first cladding portion is composed of the semi-insulating buffer layer 31, n+-conductive layer 32 and semi-insulating cap layer 33, while the second cladding portion is composed of the p-conductive layer 35. The active region 39 is sandwiched between the first and second cladding portions to form a double heterostructure.

Among carriers to be injected into the active region 39, electrons are injected thereto through the n+-conductive layer 32 from the n-electrode 36 so that the leakage of electrons to other regions than the active region 39 is negligible because the semi-insulating buffer and cap layers 31 and 33 are of high electric resistances, while holes are injected thereto through the p-conductive layer 35 from the p-electrode 37 whereby electrons and holes are recombined inn the active region 39. Accordingly, injection current is flowed only through the active region 39 so that the semiconductor laser oscillates with high efficiency to emit light in its wavelength of 1.3 μm. At the same time, current leakage is prevented from flowing between the n and p-electrodes 36 and 37 by the layer 38.

Although parasitic capacitance is produced between the n and p-electrodes 36 and 37 separated by the layer 38, and also between the n or p-electrode and heat sink provided on an opposite side of the semi-insulating substrate 30, the total value thereof is as low as 0.05 pF in a case where the distance between the electrodes, length of a resonator and thickness of the substrate are 5 μm, 300 μm and 100 μm respectively.

The parasitic capacitance is also so low in its value that the cut-off frequency is more than 13 GHz therein each if a relatively large residual inductance, for instance, more than 3nH is produced in accordance with the mounting of wire bondings. As a result, a high speed modulation can be performed in more than 10 Gb/s in the semiconductor laser.

As clearly understood from the above, the width of the active region 39 is not controloled dependent upon the precision of photolithography and chemical etching, that is, the active region 39 is not formed by such methods, but is only determined by the thickness of the n+-conductive layer 32 so that the formation of the active region 39 can be precisely controlled by use of vapor phase growth. Further, an index guide which is desirable for an optical communication semiconductor laser is obtained in accordance with the construction in which InGaAsP of refractive index larger than InP is used for the n+-conductive layer 32.

The semiconductor laser in FIG. 3 is fabricated in the following steps.

At first, the Fe-doped semi-insulating buffer layer 31, S-doped conductive layer 3 and Fe-doped semi-insulating cap layer 33 are formed in turn on the Fe-doped semi-insulating substrate 30 respectively by vapor phase growth. Thereafter, a layer of SiO$_2$ is formed on an entire upper surface thereof, and then the layer is apertured by photolithography and chemical etching to have a predetermined pattern of a mask. Next, a groove having a width of 300 μm is formed in chemical etching by use of the mask thus formed. The chemical etching is performed at a temperature of 25° C. for two minutes by use of an etchant consisting of hydrochloric acid and acetic acid (volume ratio thereof is 1 to 1). In the groove thus formed, the active layer 34 and p-conductive layer 35 are formed by vapor phase growth. A characteristic of the vapor phase growth is that the growth of layers is performed on a vertical and horizontal planes simultaneously so that the active region 39 can be formed on the vertical plane 34a of the active layer 34. In the vapor phase growth, the mask of SiO$_2$ is utilized for a selective growth wherein the growth of the layers 34 and 35 are limited only in the groove. Finally, the n and p-electrodes are provided respectively on the n and p-conductive layers 32 and 35 in an ordinal manner of photolithography.

In a process of the fabrication of a semiconductor laser described above, MOCVD (Metalorganic Chemical Vapor Deposition) may be adopted in place of vapor phase growth to provide a precisely controlled active layer in its thickness on a vertical plane.

Figure 4:
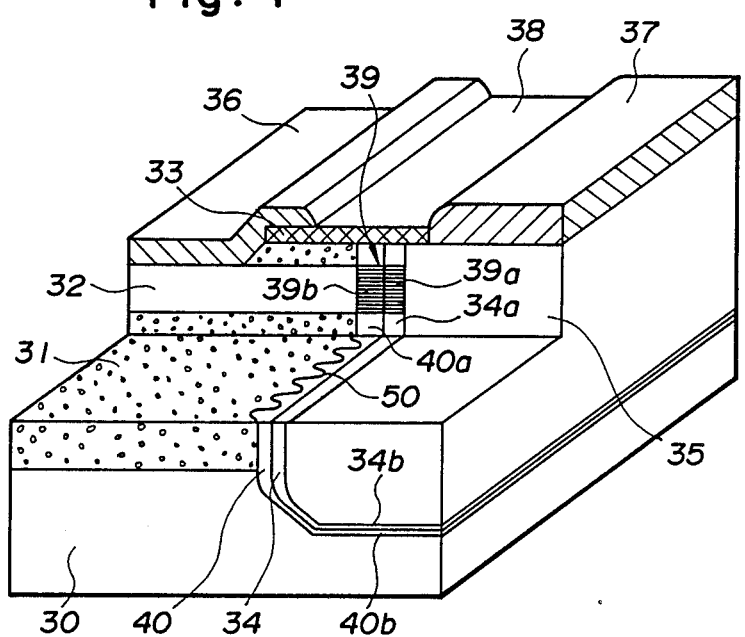
FIG. 4 is an explanatory view illustrating a semiconductor laser in the second embodiment according to the invention.

There is shown a semiconductor laser in the second embodiment according to the invention in FIG. 4 wherein like reference numerals indicate like parts in FIG. 3. In addition to the construction illustrated in FIG. 3, the semiconductor laser further comprises a light guiding layer 40 of InGaAsP having a band gap of 0.95 eV and also shaped to have a vertical and horizontal portions 40a and 40b like the active layer 39. The light guiding layer 40 is provided along the first cladding portion including the semi-insulating buffer layer 31, n+-conductive layer 23 and semi-insulating cap layer 33 with a diffraction grating at one side thereof and is in contact with the active layer 34 at an opposite side thereof. The active region 39 includes a portion 39a of the active layer 34 and a portion 39b of the light guiding layer 40 wherein the portion 39b thereof is in contact with the n+-conductive layer 32.

In the semiconductor laser described above, light is emitted in wavelength which is determined by the propagation constant and gain spectrum of the active region 39, and periodical concave and convex dimension of the diffraction grating.

Figure 5A:
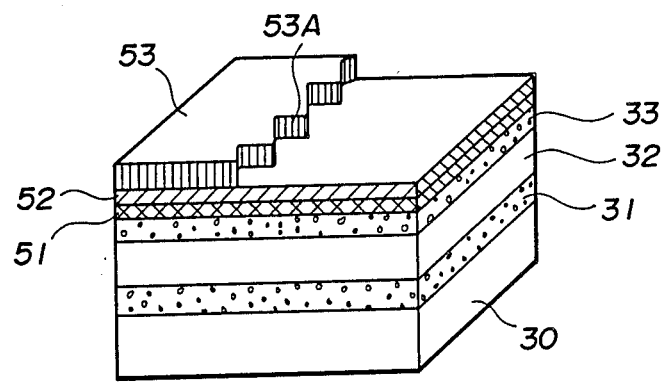
FIGS. 5A and 5B are explanatory views illustrating two steps in a process of the fabrication of a semiconductor laser in the invention.
Figure 5B:
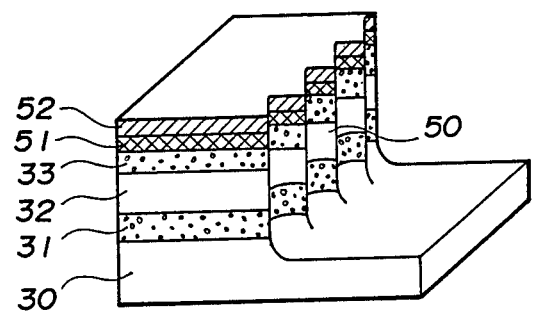

Next, a process of the fabrication of the semiconductor laser in FIG. 4 will be described in conjunction with FIGS. 5A and 5B.

At first, the first cladding portion including the semi-insulating buffer layer 31, n+-conductive layer 32 and semi-insulating cap layer 33 is formed on the semi-insulating substrate 30 by vapor phase growth in the same manenr as in the first embodiment. Then, the first cladding portion of the three layers is subject to electron beam exposure and reactive ion etching to have the configuration of a periodical concave and convex surface on a side wall thereof. For this purpose, there are formed a mask layer 51 of SiO$_2$ and a mask layer 52 of Ti in turn on the top surface of the three layers 31, 32 and 33, and then coated an electron beam resist 53 thereon which is later patterned with the configuration 53A mentioned above by electron beam exposure as shown in FIG. 5A. The depth and periodical dimension of the concave and convex configuration 53A are 100 nm and 480 nm respectively. Thereafter, the respective mask layers 51 and 52 of SiO$_2$ and Ti are etched away in accordance with a mask of the electron beam resist 53 thus patterned by use of hydro-fluoric acid, and the diffraction grating 50 consisting of a periodical concave and convex surface is provided on a side wall of the three layers 31, 32 and 33 in reactive ion etching in accordance with the Ti mask 52 thus etched as shown in FIG. 5B. Then, the light guiding layer 40, active 34 and p-conductive layer 35 are formed in turn by vapor phase growth. The damaged skin layer on the structure formed in the above reactive ion etching is removed by use of bromomethanol solution after the Ti mask 52 is removed prior to the above step of the vapor phase growth. Finally, the n and p-electrodes 36 and 37 are provided in the ordinal manner of photolithography respectively on the n+-conductive layer 32 and p-conductive layer 35.

In the semiconductor laser thus fabricated, advantageous results are obtained in its characteristics to the same extent as in the first embodiment. Further, almost the same value is obtained in coupling coefficient of the diffraction grating as that of DFB (Distributed Feedback) laser etc. so that a single longitudinal mode oscillation is resulted therein.

In the first and second embodiments described above, the band gaps of the active layer 34 are 0.95 eV and 0.8 eV respectively so that an oscillation is performed in wavelengths of 1.3 μm and 1.55 μm. Alternatively, the band gap thereof can be ranged from 0.75 eV and 0.95 eV so that the wavelength ranges from 1.3 μm to 1.65 μm in its oscillation. Further, AlGaAs/GaAs system, AlInGaP/GaAa system etc. may be adopted in a semiconductor laser according to the invention, although InGaAsP/InP system crystal is used in the above embodiments.

Although the invention has been described with respect to specific embodiment for complete and clear disclosure, the appended claims are not to thus limited but are to be construed as embodying all modification and alternative constructions that may occur toone skilled in the art which fairly fall within the basic teaching herein set forth.

What is claimed is:

1. In a semiconductor laser, including a semi-insulating substrate, first and second cladding portions, first and second electrodes, and an active region, the improvement wherein:

said first and second cladding portions are formed on said semi-insulating substrate, said active region is formed between said first and second cladding portions, said first and second electrodes are respectively provided on said first and second cladding portions, said active region has a predetermined value of band gap, said first cladding portion includes a semiconductor layer having a layer value of band gap than said predetermined value and a pair of semi-insulating semiconductor layers respectively formed on top and bottom surfaces of said semiconductor layer and having values of band gaps greater than said larger value, and said active region being disposed in contact with a side surface of said semiconductor layer between said pair of insulating semiconductor layers, and said second cladding portion is of a reverse conductive type to that of said semiconductor layer and has a value of band gap greater than said predetermined value.

2. A semiconductor laser according to claim 1, wherein said active region is a portion of an active layer, said active layer being formed between said first and second cladding portions and between said second cladding portion and said semi-insulating substrate.

3. In a semiconductor laser, including a semi-insulating substrate, first and second cladding portions, first and second electrodes, and an active region, the improvement wherein:

said first and second cladding portions are formed on said semi-insulating substrate, said active region is formed between said first and second cladding portions, said first and second electrodes are respectively provided on said first and second cladding portions, said active region has a predetermined value of band gap, said first cladding portion includes a semiconductor layer having a larger value of band than said predetermined value and a pair of semi-insulating semiconductor layers respectively formed on top and bottom surfaces of said semiconductor layer and having values of band gaps greater than said larger value, said second cladding portion is of a reverse conductive type to that of said semiconductor layer and has a value of band gap greater than said predetermined value, and said laser further comprises a light guiding layer, wherein said active region is a portion of an active layer, said active layer and said light guiding layer face and contact each other and are formed between said first and second cladding portions and between said second cladding portion and said semi-insulating substrate, a first portion of said light guiding layer is in contact with said active region and a side wall of said semiconductor layer, and a second portion of said light guiding layer is in contact with said first cladding portion on periodical concave and convex surfaces.

* * * * *

UNITED STATES PATENT AND TRADEMARK OFFICE
CERTIFICATE OF CORRECTION

PATENT NO. : 4,791,647
DATED : December 13, 1988
INVENTOR(S) : SUGOU

It is certified that error appears in the above-identified patent and that said Letters Patent is hereby corrected as shown below:

Column 1, line 15, delete "parastici" insert --parasitic--
Column 3, line 56, delete "Opertation" insert --Operation--
Column 4, line 33, delete "inn" insert --in--
Column 4, line 56, delete "controloled" insert --controlled--
Column 5, line 2, delete "3" insert --32--
Column 5, line 41, delete "23" insert --32--
Column 6, line 37, delete "AlInGaP/GaAa" insert --AlInGaP/GaAs--
Column 6, line 45, delete "toone" insert --to one--
Column 6, line 62, delete "layer" (second occurrence)

Signed and Sealed this

First Day of August, 1989

*Attest:*

*Attesting Officer*

DONALD J. QUIGG

*Commissioner of Patents and Trademarks*